June 20, 1967 L. V. GREGOR ET AL 3,326,717

CIRCUIT FABRICATION

Filed Dec. 10, 1962 2 Sheets-Sheet 1

INVENTORS
LAWRENCE V. GREGOR
PETER WHITE

BY Allen A. Meyer Jr.
ATTORNEY

United States Patent Office 3,326,717

Patented June 20, 1967

3,326,717

CIRCUIT FABRICATION

Lawrence V. Gregor, Chappaqua, and Peter White, Shenorock, N.Y., assignors to International Business Machines Corporation, New York, N.Y., a corporation of New York Filed Dec. 10, 1962, Ser. No. 243,468
22 Claims. (Cl. 117—212)

This invention relates to a method of fabricating electrical circuits and, more specifically, to a method and apparatus for fabricating thin film electrical circuits of the microminiature type.

With the development of extremely complex and large scale electrical systems as exemplified, for example, by present day general purpose digital computers; the volume occupied by and the power dissipated in such systems have increased enormously. To reduce the magnitude of each of these items, developments have recently been directed to the design of solid state circuitry and to methods of fabricating such circuits. Examples of materials in solid state circuitry include semiconductors and superconductors. Further, components fabricated of these materials have been reduced both as to volume and power dissipation through the application of thin film technology Generally, thin films of selected materials are preferably fabricated by thermal evaporation of each material onto a substrate within an evacuated chamber, selected pattern masks being employed as required to define the deposited geometry of each material. This vacuum deposition technique has advantageously been employed to fabricate, in quantity, a large variety of solid state circuits.

Still more recently, a further advance in minimum volume combined with low power loss has evolved through what has become generally known as microminiaturization, that is, the dimensions of components and interconnection lines within a circuit assembly are equal to or less than one thousandth of an inch. Although it is desirable to fabricate microminiature circuits by vacuum deposition, several problems have arisen. By way of example, since portions of the circuitry may have a width measured in terms of one or more microns (1 micron=$10^4$ Angstrom units), it has been difficult to fabricate precision pattern masks with apertures of this width so as to define the deposited geometry, wherein the mask also has sufficient rigidity to properly register the depositant upon the substrate. Again, if a proper mask is obtained, a further problem arises during the deposition due to the fact that a portion of the evaporated material adheres to the mask and alters the dimensions of the apertures therein and, in fact, may result in the closure of a portion of or all of one or more apertures. Finally, it should be noted that when evaporation techniques are employed, it has proved difficult to simultaneously fabricate solid state circuitry upon a large area substrate with a high degree of reliability. This is a result of the well known shadowing effect which causes both uneven thickness distribution of the depositant material upon a large area substrate and, further, causes distortion in the deposited configuration due to the angular direction of the evaporated molecules.

Heretofore, it has not been possible to utilize the full potentialities of microminiaturization of electronic circuitry because of the problem discussed previously, the limit of definition being of the order of 0.001 inch. However, the use of optical tehcniques affords a means of reducing in size a pattern or stencil which can be fabricated easily to dimensions of the order of 0.001 inch. Thus, a pattern can be generated whose resolution is limited only by the quality of the optical system and can be 0.0001 inch, for example. The usefulness of such a high-resolution pattern is, of course, dependent upon discovering a method through which the pattern can be transferred to the physical components involved in solid state electronic circuitry such as thin films. One such process may involve the use of a chemical reaction which is catalyzed by electromagnetic radiation; specifically, a photolytic reaction involving ultraviolet radiation. A pattern of ultraviolet light impinging on a surface capable of undergoing such a reaction would then be transferred onto the surface, and the surface pattern would then possess a degree of resolution equivalent to the optical pattern. A suitable technique or techniques can then be used to transform the surface pattern into microminiaturized electronic circuit components.

What has been discovered is a method of fabricating thin film circuits, as well as thin film microminiature circuits without being limited to the resolution obtainable when employing a pattern mask to intercept portions of the material. In accordance with one aspect of this invention, the method comprises directing a vapor, capable of being photolytically decomposed, over a thin film previously deposited on a substrate and irradiating said film to as to react selected portions of said film in any required geometric pattern by, for example, a source of light of predetermined wavelength or an electron beam. Note should be made of the fact that since a directed beam of light forms the required geometric configuration upon the film, it is not necessary that the light mask have a surface configuration which corresponds exactly to the contour of the film and the substrate in order to attain precise registration. Rather convex, concave, or other particular shaped light masks are employable in combination with a planar substrate depending, of course, upon the optical system employed. By the method of the invention in the various embodiments to be hereinafter described in detail, predetermined patterns of various layers of conductors and resistive elements can be selectively produced on a substrate to form the required thin film circuit.

It is an object of the invention to provide an improved method of fabricating thin film circuits.

Another object of the invention is to provide a method of fabricating microminiature thin film circuits upon a substrate within a chamber wherein no pattern mask is positioned within the chamber to define the circuit geometry.

Still another object of the invention is to provide an improved method of fabricating thin films of material having a predetermined geometry.

A further object of the invention is to provide a method of forming microminiature thin film circuits upon a substrate by selectively directing light at a predetermined wavelength onto the thin film on the substrate in a pattern determined by the circuit geometry and in the presence of a vapor capable of reacting through a photolytic reaction.

Yet another object of the invention is to provide a method of fabricating microminiature thin film circuits having dimensions in the range of thousands of Angstrom units and in a predetermined geometric pattern wherein a pattern defining mask includes apertures dimensioned to a scale other than the scale of the predetermined pattern.

A still further object of the invention is to provide a method of employing light to determine the geometry of deposited thin film conductors and resistive elements.

A further object of the invention is to provide an improved method of fabricating solid state microminiature circuitry.

Yet another object of the invention is to provide an improved method of fabricating thin film superconductive circuits.

Still another object of the invention is to provide an improved method of fabricating thin film semiconductor circuits.

Another object of the invention is to provide an improved apparatus for fabricating microminiature solid state circuitry.

The foregoing and other objects, features and advantages of the invention will be apparent from the following more particular description of preferred embodiments of the invention, as illustrated in the accompanying drawings.

Figure 1:
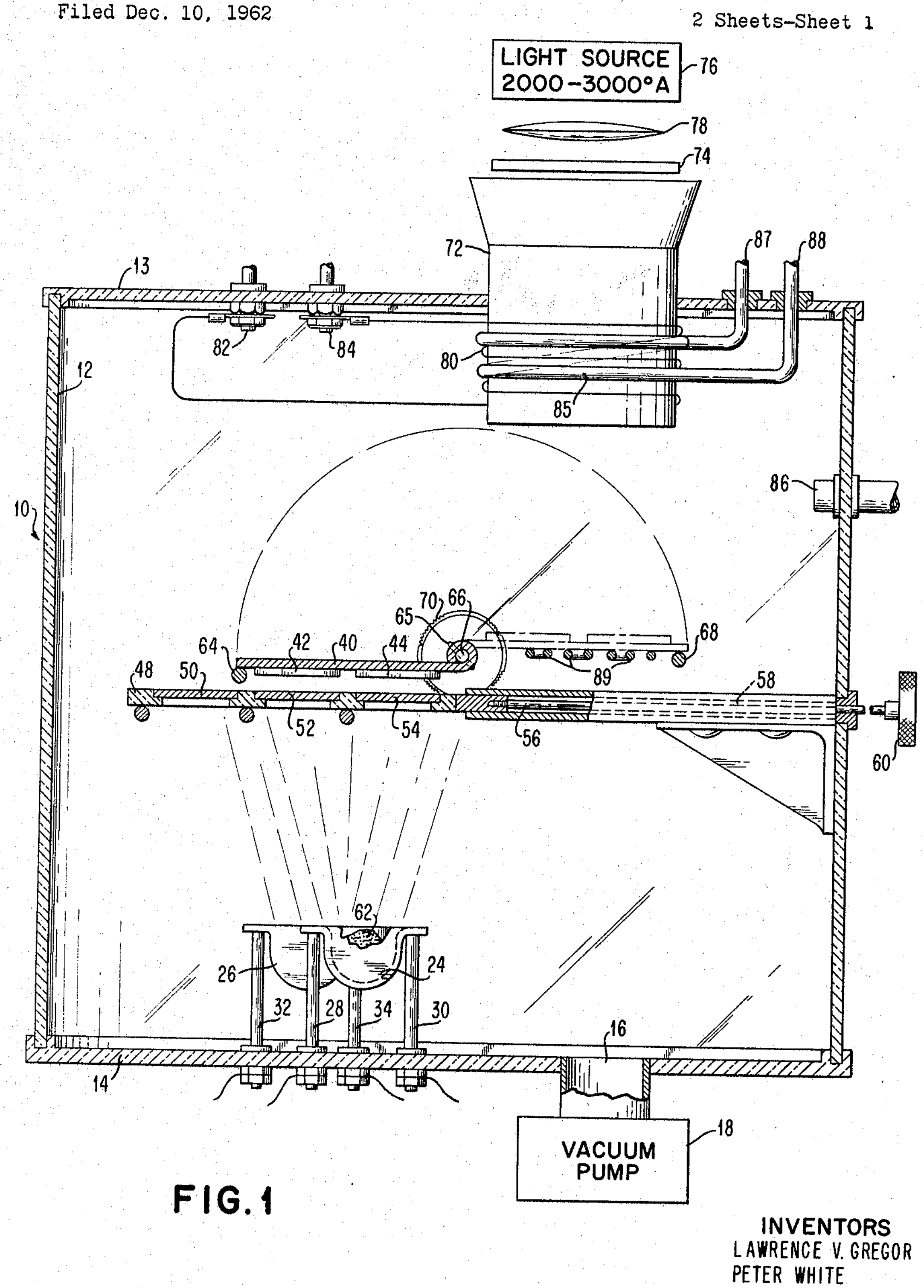
FIG. 1 illustrates an apparatus useful in practicing the method of the invention.

Referring now to the drawings, there is shown in FIG. 1, an apparatus useful in practicing th method of the invention, it being understood that various modifications to the illustrative apparatus may be made as required. As shown, a vacuum chamber 10 comprises a cylindrical housing 12, which may be fabricated of either glass or metal, to which are secured upper and lower base plate members 13 and 14, respectively. An opening 16 is provided in lower base plate 14 through which is connected a conventional vacuum pump 18 used to both evacuate chamber 10 as well as to maintain a predetermined pressure therein. Pump 18 may include any of the various combinations of pumps presently employed in vacuum technology such as, by way of example, the combination of a rotary mechanical roughing pump and a high vacuum oil diffusion pump. Also secured within chamber 10 and supported by lower base plate 14 are several cuplike evaporation source structures of which two are shown 24 and 26. Source structures 24 and 26 are secured to base plate 14 by rods 28 and 30 and 32 and 34, respectively. Since it is necessary to supply thermal energy to source structures 24 and 26 in order to evaporate material contained therein, rods 28 through 34 may preferably be fabricated of copper and, further, extend by means of conventional vacuum seals through base plate 14, as shown. By coupling a source of low potential high current electrical energy to each pair of rods selectively and individually, thermal energy is supplied to sources 24 and 26 as a result of current flow therethrough. For this reason, sources 24 and 26 are each preferably fabricated of graphite, although other materials may be employed as may other methods of heating these sources such as inductive heating by way of example. Any number of sources may be employed as desired. Positioned above sources 24 and 26 is a hinged substrate holder 40 which supports, by conventional means, a pair of substrates 42 and 44, a greater or lesser number of substrates being employed as required. Positioned intermediate holder 40 and the sources 24 and 26, is a mask holder 48 wherein individual masks are inserted to define predetermined geometric patterns upon substrates 42 and 44. Only three masks 50, 52, and 54 are illustrated in FIG. 1, it being understood that a greater or lesser number of masks may be employed as desired. In order to position particular masks between the individual substrates and the evaporation sources, means are also provided to longitudinally move mask holder 48 which include a rack and pinion arrangement indicated generally as 56 and driven external of chamber 10 through a shaft 58 coupled to knob 60.

The components of the system described above are those normally found in a vacuum deposition apparatus specifically designed to form multilayer thin film circuits.

A typical sequence of operations of the above described apparatus comprises placing an evaporation charge in one or more of the source structures such as shown by a charge 62 within source 24, positioning the desired mask adjacent substrate 42 upon which the layer of material 62 is to be formed, evacuating chamber 10 to a predetermined pressure, and supplying thermal energy to source 24 sufficient to evaporate charge 62. In this manner, vapors of the materials are directed upwardly from source 24 through the particular mask which defines the geometry of the thin film being deposited upon substrate 42 and deposited in the defined geometric pattern upon the substrate. When a sufficient thickness of depositant has formed, the supply of thermal energy to source 24 is terminated and, further, a movable shutter (not shown) may be interposed between the source and substrate to prevent additional particles of the charge from arriving at the substrate. Should a second layer be required upon the substrate, mask changer 48 is moved to position another of the masks between source 26 and the substrate and a similar evaporation is obtained from source 26. Further information on apparatus, materials and techniques employed in the fabrication of thin film circuits is found in the volume entitled, "Vacuum Deposition of Thin Films" by L. Holland, published in 1958 by John Wiley and Sons, Inc., New York.

As further shown in FIG. 1 additional equipment is incorporated in the apparatus which is particularly useful in practicing the method of this invention. Substrate holder 40, which is shown supported by a stop rod 64 has the opposite end connected to a hinge 66. Holder 40 is rotatable in a 180° arc about hinge 66 by means of a worm drive 65 coupled to shaft 68 and knob 70 to obtain the position shown in the dashed outline of FIG. 1 wherein holder 40 is supported by a second stop rod 68. In this alternate position, the surfaces of the substrates are now positioned below a quartz light pipe 72 which extends through upper base plate 13. Further positioned above this light pipe and external of the chamber is a light mask holder 74. Finally, a source of light indicated generally as 76 and including selected optical filters is positioned above mask holder 74 and a lens system 78. In this manner, light at a predetermined and selected wavelength is focussed and directed through one or more masks positioned in mask holder 74, and thereafter conveyed by means of quartz pipe 72 through upper base plate 13 to the surfaces of the substrates. As more particularly explained hereinafter, source 76 is effective to generate light at a wavelength in the 2000 to 3000 Angstrom unit range, although other wavelengths can be employed to break the bonds of the particular materials selected according to the method of the invention as will be understood by those skilled in the art. For this reason, quartz is employed in light pipe 72 since it is essentially transparent to light of these wavelengths whereas glass or the like is opaque. Further, positioned about the lower end of light pipe 72 is a coil of heating wire 80 connected to a pair of terminals 82 and 84 extending through upper plate 13. Coil 80 is effective during certain photolytic operations to prevent material from adhering to the surface of pipe 72 and thereby obstructing a portion of the light directed towards the substrate. In a similar manner, a cooling coil 85 is also positioned about the lower end of pipe 72. By means of an inlet port 87 and an outlet port 88, water or other similar fluid is caused to circulate through coil 85 and is effective during selected photolytic operations to maintain pipe 72 at or about room temperature to further prevent material from adhering to the surfaces thereof. Additionally, a temperature controller 89 is positioned adjacent to substrate holder 40 when in the dotted position indicated in FIG. 1, and is selectively operable to control the temperature of substrates 42 and 44. Next, extending through the side wall of housing 12 is an inlet conduit 86 selectively connected to one or more sources of particular organic vapors and etching vapors (not shown)

which are employed in the photolytic reactions, as more particularly described in the detailed description of the method of the invention to follow. It is thus seen that the apparatus illustrated in FIG. 1 comprises essentially a system for forming and fabricating thin films upon the substrate, utilizing conventional thermal evaporation and the photolytic system for generating an etch resistant latent image in accordance with this invention.

Before proceeding with the detailed description of the several embodiments of this invention, a brief resume of several types of solid state circuitry is next briefly described. First, superconductive circuits may advantageously be employed in large scale electrical systems. By way of example, reference is first made to U.S. Patent No. 2,832,897 issued Apr. 29, 1958, to D. A. Buck. This patent describes a superconductive circuit known as a cryotron. The cryotron consists, essentially, of a first, or gate, conductor about which is wound a second, or control, conductor. Each of these conductors is formed of a superconductive material, that is, a material which exhibits superconductivity below certain predetermined temperatures. Superconductivity is characterized by the absence of electrical resistance to the flow of electric current. At the operating superconductive temperature, current flow through the control conductor is effective to generate a magnetic field of sufficient intensity to quench superconductivity in the gate conductor, the gate conductor then exhibiting normal electrical resistance. Moreover, the control conductor is generally fabricated of a material different from the gate conductor material and exhibits superconductivity for all values of magnetic fields generated in the cryotron. Through the interconnection of various gate and control conductors of a number of cryotrons, various logical circuits have been designed, several of which are shown and discussed in the above patent.

The wire wound cryotron shown in the patent to Buck is inherently a relatively slow device. This results from the low value of resistance exhibited by the gate conductor when in the resistive state and the high value of inductance exhibited by the control conductor winding. For this reason, and together with the reasons for the microminiaturization of electrical circuits discussed above, improved cryotron type devices have been developed, one of which is described in copending application Serial No. 625,512, filed Nov. 30, 1956, on behalf of Richard L. Garwin and assigned to the assignee of this invention. These improved cryotron-type devices include a first thin film operable as the gate conductor having associated therewith a second thin film insulated from the first which is operable as the control conductor. Further, a superconductor shield is also employed to reduce the inductance of the components to obtain increased switching speed, and simultaneously, the resistance of the gate conductor has been increased through the use of the thin film form of gate conductor. Devices of this improved type may be advantageously fabricated through the method of this invention as described in detail hereinafter.

With respect to semiconductor devices and circuits formed thereby, reference may be had to U.S. Patent No. 2,655,625 which shows complex semiconductor circuits fabricated of a single block of semiconductor material. Circuits of this type, as well as semiconductor circuits in general, may also be advantageously fabricated in accordance with this invention as is also described in detail hereinafter. Semiconductors are broadly classified as conductors which exhibit a resistivity value intermediately between conventional conductors and insulators. Specifically, semiconductors exhibit extrinsic conductivity in two groups, the first, or N-type semiconductors, contain an excess of electrons, or negative current carriers and the second, or P-type semiconductors, contain an excess of "holes," or positive carriers of electrical current. N and P-type materials are determined by the predominant number of excess impurities in the semiconductor material.

Although many types of impurities and semiconductor materials have been developed, many of these devices are fabricated of germanium or silicon to which impurities of the Group III elements of the Periodic Table are added to produce P-type conductivity, or alternatively, elements of Group V of the Periodic Table are added to produce N-type conductivity. By forming one or more contiguous regions of N-type and P-type materials, diodes, transistors, and tunnel diodes have been fabricated, and it is to devices of this type and combinations thereof to which the method of the invention in one embodiment is particularly adapted.

Before describing in detail illustrative examples of the method according to the invention as applied to the fabrication of solid state circuitry, the basic theory of the invention together with several specific examples are next discussed to indicate the wide range of embodiments afforded by the invention. In each of the specific examples, note should be made of the fact that by proper selection of both temperature and pressure the required reaction can be achieved. It has been known that many organic molecules can be elevated to excited states by absorption of radiation at a predetermined wavelength. Molecules in these excited states may then react with unexcited molecules or, alternatively, may decompose to yield products which may or may not be stable. When these products are not stable, a further reaction may occur with unexcited molecules to yield further products and often a complex chain reaction can occur before the final stable products are formed. Many ordinary vapors have absorption bands in the ultraviolet wavelength range.

For the purposes of this invention, the gases to be photolyzed should possess the following characteristics:

(1) strong absorption of light in the wavelength region between 2000 and 3000 Angstrom units, leading to photolysis and the formation of an excited molecule, atoms or free radicals, one or more of which is capable of reacting with the surface of a thin film;

(2) the chemical properties of the remaining photolysis products should be such as to yield products which are not deleterious to the electronic properties of the films under consideration;

(3) the vapor pressure should be appreciable, i.e. it should be at least 0.1 mm. Hg.

These characteristics are possessed by certain inorganic gases as well as certain organic vapors. Examples of the inorganic gases are nitrogen dioxide (and its dimer, dinitrogen tetroxide), chlorine dioxide and a mixture of nitrous oxide and oxygen. Some examples of the organic vapors which meet the above requirements are the lower molecular weight nitro-alkanes (e.g. R—$NO_2$ wherein R is a radical selected from the group consisting of methyl, ethyl, propyl, iso-propyl, butyl, iso-butyl, tert-butyl, and sec-butyl). Other examples are the halo-alkanes (e.g. methylene chloride); and nitroaryl (e.g. nitrobenzene); nitroalkylaryl (e.g. nitrotoluene); and haloaromatic (e.g. phenyl chloride) compounds.

The mechanism of the photolysis will be discussed with respect to one of the nitro-alkanes, that is, nitromethane. Photolysis produces among other products the radical $NO_2\cdot$ which is capable of reacting with a wide variety of thin film surfaces to form a stable surface compound. If ultraviolet light of proper wavelength is allowed to illuminate gaseous nitromethane, it will be photolytically decomposed. The proper wavelength region is between 2000 A. and 3000 A. The decomposition products may either recombine, react with the surface of this thin film, or react with other decomposition products. For certain classes of thin films, the $NO_2$. radical produced by the photodissociation reacts with the film surface to form a compound. The $CH_3$. radical reacts with another $CH_3$. radical to form the volatile gas ethane. Thus, there is left a surface film composed of a compound of $NO_2$. and the film material and no residue.

There are three classes of materials capable of being deposited as thin films which will undergo this type of surface reaction:

(1) Evaporated metallic films of Group IV and transition metal elements of the Periodic Table, e.g. Sn, Ge, Si, Fe, Pb, etc.:

(2) Evaporated or chemically-deposited binary alloy films of Group IV elements of the Periodic Table such as Sn-Ge, Pb-Sn, Ge-Si, Pb-Ge, etc.; binary alloy films of transition metal elements of the Periodic Table such as for example Ni-Fe, Ti-Fe, etc.:

(3) Evaporated or chemically-deposited intermetallic compound films of Group II–V elements, III–V elements, II–VI elements and III–VI elements of the Periodic Table, such as GaAs, CdS, CdSe, ZnP, InTe, GaP, GaSb, InSe, InAs, etc.

Specifically a thin film of tin may be irradiated with ultraviolet light in the presence of nitromethane at a partial pressure of 5 mm. Hg for 10 minutes. The geometric pattern of the impinging ultraviolet radiation is undetectable; however, if the substrate bearing the tin film is treated with a chemical etching reagent, such as 4 N nitric acid, the portions of the tin film which were not exposed to ultraviolet light are dissolved completely in 1 second while the portions which were exposed to the ultraviolet light are not effected. Thus, the latent image has been developed as a geometric pattern conforming to the pattern of the light. An alkaline etch such as NaOH or KOH is also effective. A second example is germanium, in which the same results are obtained if aqua regia is the etching reagent. Alternatively, gaseous hydrogen fluoride may be used as a vapor-phase etching reagent for silicon films. Still another example is afforded by an evaporated film of gallium arsenide in which the latent image can be developed by a spray etching technique using nitric acid. The theoretical explanation advanced for this result is that the compound formed between the $NO_2$. radical and the thin film protects the film and renders it unreactive towards chemical attack by reagents which easily dissolve the unexposed film regions, i.e. the latent image is protected by the product of the surface reaction and is thus capable of subsequent development. The surface reaction product is extremely thin and hence the resolution attainable is effectively determined only by the optical resolution of the image pattern and the specific nature of the etchant.

The surface reaction product which exists on the developed latent image surface does not hinder the establishment of electrical contact with other geometric patterns or circuit configurations formed by evaporation or other means. In other words, it is not necessary to remove the surface compound to facilitate the establishment of electrical contact with a subsequent thin film.

The resolution of the geometric pattern formed by this method depends upon two factors. The first of these factors is the definition with which the light pattern can be focused upon the surface. This resolution is determined solely by the optical system employed. The second of these factors is the migration rate of the decomposition products which is dependent upon the relative ratio of the reaction rate and the surface diffusion of the photolyzied particles. Since, generally, in a free radical reaction, the lifetime of the unstable intermediate products is limited to about 1 millisecond before further reactions occur, essentially the definition afforded by the optical system is resolved upon the surface whereat the reaction occurs. In general, thermal evaporation of the material through a pattern defining mask limits the width of the deposited geometry, whether an insulating material or metallic material, to approximately one-thousandth of an inch. By the method of the invention, however, circuits having widths in the order of 10,000 Angstrom units may be attained.

Consider now the photolytic reaction effective to etch a thin metallic or semiconducting film to obtain a desired thin film configuration. After a thin metallic or semiconducting film has been deposited upon the entire surface of a substrate within an evacuated chamber, for example, by thermally evaporating the metallic or semiconducting material onto the substrate, the introduction of an organic vapor capable of a photolytic reaction with the light of a predetermined wavelength is thereafter effective to produce a surface reaction with the metallic or semiconducting film. The reaction occurs only on the regions of the metallic or semiconducting film surface exposed to the light of the predetermined wavelength. By use of a light mask or template, placed either inside or outside the system in such a fashion as to intercept the light beam, the surface of the metallic or semiconducting film is thus exposed to a predetermined pattern of light. The photolytic reaction produces a chemical species which reacts with the surface layer of the metallic or semiconducting film to generate a layer of material resistant to chemical etching reagents which attack and remove the unexposed portions of the film. A positive latent image of the predetermined pattern is formed which is incapable of detection except by subsequent chemical etching. This image is capable of being developed, in the sense of producing the pattern, by subsequent exposure of the metallic or semiconducting film to a variety of chemical etching reagents either in the vapor phase or the liquid phase.

This method is especially suited for the production of microminiaturized circuits since the size of the mask which determines the area being preferentially exposed can be of any convenient size; the directed pattern of light defined by this mask thereafter being focused by optical means to produce the required pattern size upon the surface of the substrate. Further, this reaction can be attained by first depositing the metal in a pattern which corresponds roughly to the final desired configuration, the photolytic reaction thereafter being employed to precisely determine the dimensions of the finished circuit.

Figure 2A:
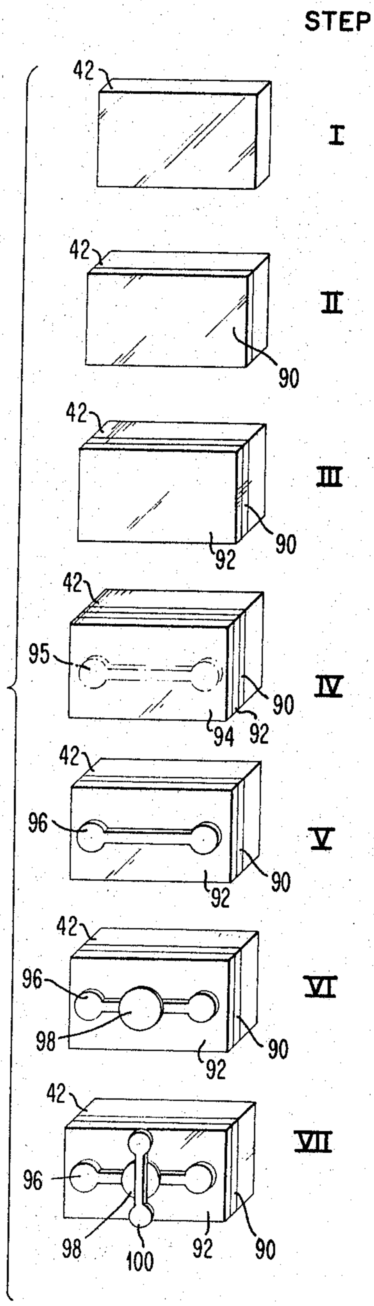
FIG. 2A illustrates the various layers formed upon a substrate during the fabrication of a superconductive component according to the method of the invention.
Figure 2B:
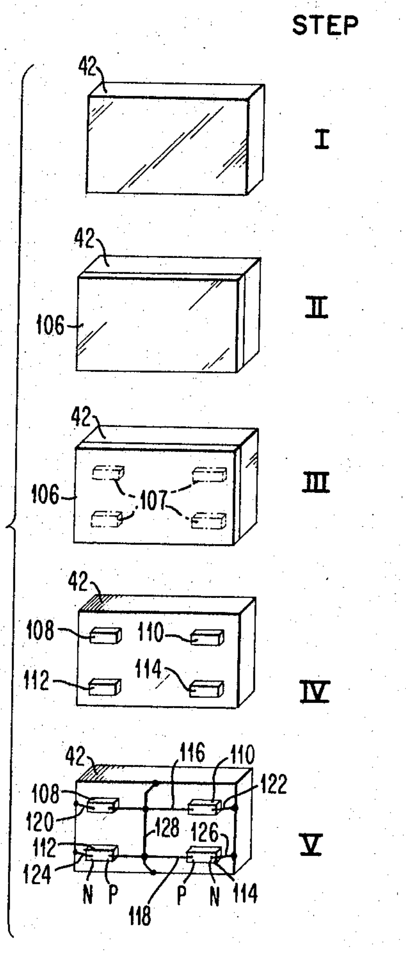
FIG. 2B illustrates the various layers formed upon a substrate during the fabrication of a semiconductor circuit, according to the method of the invention.

For a more complete understanding of the method of the invention, reference should now be had again to the drawings which show in FIGS. 2A and 2B several microminiature circuits fabricated according to the method of the invention. FIG. 2A shows a particular sequence of steps in the formation of a thin film superconductive cryotron of the type disclosed in the above referred Garwin copending application, it being understood that a plurality of cryotrons together with their interconnections could simultaneously be fabricated. Further, the particular sequence chosen by way of illustration includes first the formation of a pair of coatings by conventional vacuum deposition techniques.

As shown in step I of FIG. 2A, the initial step in the fabrication of the thin film cryotron is to provide a clean substrate of glass or the like which forms a support for the cryotron. Referring at this time also to FIG. 1, the substrate 42 is shown positioned in holder 40 below which is positioned mask 52. During the first steps in the fabrication of the cryotron, according to the invention, it is not necessary to employ a pattern defining mask; therefore, mask 52 has an opening significantly larger than substrate 42. At this time source 24, which contains a charge of lead, is subjected to an elevated temperature to evaporate a portion of the charge therein. This charge is directed through open mask 52 onto the surface of substrate 42 to coat substrate 42 with a layer 90 of lead, as shown in step II of FIG. 2A, having a thickness of approximately 1000 Angstrom units; this lead layer thereafter being effective as the superconductive circuit shield as described in the above-identified Garwin reference. The next step in the process is to subject source 26, which contains a charge of silicon monoxide, to an elevated temperature so as to deposit a portion of this material through mask 52 onto the lead layer 90 on substrate 42. Again, the deposited silicon monoxide material completely covers the entire surface of the lead layer 90 on substrate 42 thereby providing an insulating layer 92, indicated in step III of FIG. 2A.

Next in the process a source structure (not shown), similar to source 24 and containing a charge of tin, is subjected to an elevated temperature. A portion of the tin charge is thereby evaporated and directed through mask 52 to produce a tin film 94 on silicon monoxide layer 92, which tin film is approximately 5000 Angstrom units thick and covers the entire face of the silicon monoxide layer 92. The tin film 94 is electrically insulated from the lead coating 90 by the silicon monoxide coating 92.

Next, holder 42 is rotated 180° about hinge 66 to obtain the position indicated by dash lines in FIG. 1. At this time, a light mask, which defines the geometry of the gate conductor of the cryotron being fabricated, is positioned within holder 74 and gaseous nitromethane is bled into evacuated chamber 10 through opening 86. Next, heater 89 is operated to regulate the temperature of substrate 42. Further, at this time a source of water, or other coolant, is connected to inlet and outlet ports 87 and 88 to maintain the temperature of quartz light pipe 72 at approximately room temperature. Next, light source 76 is energized to direct the predetermined pattern of ultraviolet light upon the surface of the tin film substrate 42. The portion of the tin film 94 irradiated by the ultraviolet light is converted to an etchant resistant pattern 95 or latent image. After an exposure of a few minutes, for example, one to five minutes, the pattern is fixed. The introduction of the nitromethane vapor through conduit 86 is terminated, and vacuum pump 18 is thereupon effective to remove the gaseous nitromethane present within the chamber 10. At this time the cooling of pipe 72 and the temperature regulation of substrate 42 are discontinued. At the end of this step, the pattern exists as the latent image of the desired configuration and is shown in step IV of FIG. 2A by phantom lines. The next step is to expose the substrate 42 with its various coatings to a chemical etchant. The etchant may be introduced through inlet tube 86 as a vapor-phase etchant (hydrogen chloride) or the substrate 42 may be removed from the chamber and placed in a liquid etchant (nitric acid). For example, the substrate 42 may be immersed for one second in a bath of nitric acid having a concentration of 4 N maintained at 25° C. This treatment suffices to dissolve completely the unexposed portions of the tin film 94 and as a result the predetermined pattern is left on the silicon monoxide layer 92 in its desired configuration 96 shown as a dumbbell pattern in step V. If the coated substrate has been exposed to a liquid phase etchant, the coated substrate is reinstated in its holder 40. If, on the other hand, the technique of vapor-phase etching has been used to develop the pattern in situ in the chamber, the coated substrate is already in place in the chamber 10. The coated substrate and its holder 40 are rotated again through 180° so as to be in position for the next step. The crucible 26 containing silicon monoxide is heated to evaporate a portion of the charge through a suitable mask to define the pattern 98 shown in step VI. The thickness of this coating of silicon monoxide is approximately 5000 Angstrom units. Next, the lead charge in crucible 24 is heated to evaporate a portion of the lead through a suitable mask to define the pattern 100 shown in step VII The substrate 42 now bears a superconductive cryotron circuit composed of the lead superconductive shield 90, the base insulation coating 92, the microminiature gate element composed of tin 96, the insulation layer 98, and the control element composed of lead 100. Although for simplicity only the fabrication of the gate element 96 has been exemplified by this invention, the configuration of the control element 100 can be shaped by the techniques of this invention, since lead coatings can be manipulated as well as tin coatings by the techniques embodied in this invention.

For a further understanding of the advantages afforded by the method of the invention, a further particular sequence of steps is illustrated in FIG. 2B to fabricate an elementary semiconductor circuit. Again the sequence of steps begins with a clean substrate 42 as shown in step I of FIG. 2B which, depending on circuit applications, may be glass, metallic, or semiconductive material such as germanium or silicon. Substrate 42 is positioned in holder 40 in the dashed position shown in FIG. 1 immediately below light pipe 72. The chamber is then evacuated and a mask is positioned in holder 74 as determined by the circuit configuration.

Next, germanium is deposited on the surface of substrate 42 by any one of a variety of techniques, for example, by evaporation or by vapor deposition. This layer is indicated by reference numeral 106 the step II in the sequence illustrated in FIG. 2B. Nitromethane is then introduced through conduit 86. Light source 76 is next operated to project an image of the required pattern onto the germanium film 106. After an exposure of a few minutes, the pattern 107 is fixed in the germanium surface as shown in step III of FIG. 2B in phanton lines. Again light from source 76 and the source of nitromethane connected to conduit 86 are terminated and the continued operation of vacuum pump 18 is effective to remove any remaining nitromethane.

The latent image 107 so formed is resistant to attack by a number of chemical etching reagents such as aqua regia which attack and remove the unexposed germanium surface. The result is to produce a configuration of germanium similar to the latent image formed in the germanium. This is shown in step IV in FIG. 2B as 108, 110, 112, and 114.

Finally, through a like sequence of operations, interconnection lines are formed upon the surface of substrate 42 as required by the circuit design. By way of example, a pair of zinc lines 116 and 118 are deposited to connect germanium die 108 to germanium die 110 and germanium die 112 to germanium die 114, respectively. Next, each of the germanium dies are further connected by additional lines which may be preferably of antimony as indicated by lines 120, 122, 124 and 126. Finally, a further interconnection line 128 of any selected material may also be deposited. Thereafter the substrate, with the interconnection lines deposited as shown, is raised by means of heater 89 to an elevated temperature sufficient to diffuse a portion of the interconnection lines secured to the germanium dies into and through the germanium to alter the conductivity thereof. For the interconnection lines as described above comprising zinc and antimony, the diffusion of zinc into and through each of the dies is effective to convert this diffused region to P-type conductivity and, conversely, the diffusion of the antimony is effective to form N-type conductivity regions. In each of die 108, 110, 112 and 114 the P and N-type regions contact in a barrier which forms a P-N junction. Thus each of the four wafers as shown are converted to conventional P-N diodes. It should now be obvious that, through a further sequence of steps and operations, more advanced devices such as transistors, tunnel diodes, and the like may be selectively formed upon the surface of the substrate. Thus, a particular sequence of steps has been illustrated which is readily adaptable to form complex microminiaturized semiconductor circuits in quantity.

It should be noted that particular materials, times, and pressures have been stated only by way of example it being understood that an extremely wide range of materials and the specific operating conditions may be employed without departing from the spirit of this invention.

The invention described herein provides a method whereby there is no longer a limit on the circuit dimensions imposed by the minimum aperture dimensions of the mask which can be fabricated. Furthermore, the predetermined patterns of thin films prepared and used in fabricating the circuit have a higher resolution than was heretofore possible. Thus, while in many circuits (e.g. semiconducting circuits) a minimum size is also imposed by the power requirements, this method would appear to have greater potential with respect to cryogenic circuitry wherein very little power dissipation is anticipated.

While the invention has been particularly shown and described with reference to preferred embodiments thereof, it will be understood by those skilled in the art that various changes in form and details may be made therein without departing from the spirit and scope of the invention.

What is claimed is:

1. A method for fabricating a high resolution thin film pattern on a substrate comprising illuminating the surface of a thin film of selected material formed on a substrate with light of a predetermined wavelength in a predetermined geometric pattern and in the presence of a photolyzable gas which upon photolysis reacts with said thin film surface to produce a stable reaction product defining a positive latent image of said pattern on said thin film surface, and subsequently developing said latent image by exposing said thin film to a chemical etchant reactive with said selective material and unreactive with said stable reaction product to remove unilluminated portions of said thin film.

2. A method for fabricating high resolution thin film patterns on a substrate which comprises:

(a) providing a substrate with a thin film of selected material thereon;

(b) exposing the surface of said thin film to a photolyzable gas which upon photolysis produces a chemical entity which reacts with the surface of said thin film to produce a stable surface reaction product formng an adherent coating;

(c) illuminating selected surface areas of said thin film with light of a predetermined wavelength to produce said reaction product and form a positive latent image in a predetermined geometric pattern on the surface of said thin film; and (d) developing the latent image by exposing said thin film to a chemical etchant reactive with said selected material and unreactive with said reaction product to remove unilluminated surface areas of said thin film.

3. The method of claim 2 wherein said photolyzable gas has a vapor pressure of at least 0.1 mm. Hg, exhibits strong absorption of light in a wavelength region between 2000–3000 A., and reacts to produce photolysis products having chemical properties not deleterious to the electronic properties of said thin films.

4. The method of claim 2 wherein the photolyzable gas is an inorganic compound containing nitrogen in combination.

5. The method of claim 2 wherein the light has a wavelength between 2000–3000 A.

6. A method of fabricating high resolution microminiature thin film solid state circuitry upon the surface of a substrate comprising:

(a) placing a substrate in an evacuated chamber;

(b) depositing at least a first thin film of selected material upon said substrate;

(c) introducing into said chamber a photolyzable gas which upon photolysis produces a chemical entity which reacts with surface of said first thin film to produce a stable surface compound forming an adherent film on said first thin film surface;

(d) illuminating said first thin film with light of a predetermined wavelength in a predetermined pattern and in the presence of said photolyzable gas to produce said adherent film and define a positive latent image of said first pattern on said thin film surface; and (e) removing unilluminated portions of said first thin film to develop said positive latent image by exposing said first thin film to a chemical etchant reactive with said selected material and unreactive with said surface compound.

7. The method of claim 6 wherein said first thin film is deposited by vapor deposition.

8. The method of claim 6 wherein electrical contact is made to said developed positive latent image by subsequent deposition of electrically conductive materials in a predetermined pattern.

9. The method of fabricating a thin film superconductive circuit element upon a substrate which comprises:

(a) positioning a substrate in an evacuated chamber;

(b) depositing by thermal evaporation a superconductive shield plane on said substrate;

(c) depositing on said superconductive shield plane a first insulating layer;

(c) depositing by thermal evaporation on said first insulating layer a thin film layer of gate superconductor material;

(e) providing said chamber with a photolyzable gas which upon photolysis produces a chemical entity which reacts with said thin film layer of gate superconductor material to produce a stable surface compound forming an adherent film, (f) illuminating said thin film layer of gate superconductor material with light of a predetermined wavelength in a predetermined pattern and in the presence of said gas to produce said adherent film and define a positive latent image in said predetermined pattern on the surface of said thin film layer of gate superconductor material;

(g) removing unilluminated surface portions of said thin film layer of gate superconductor material to develop said positive latent image by exposing said thin film layer of gate superconductor material to a chemical etchant reactive with said gate superconductor material and unreactive with said surface compound;

(h) depositing a second insulating layer in a predetermined pattern on said developed positive latent image of gate superconductor material; and (i) depositing by thermal evaporation in a predetermined pattern on said second insulating layer a thin film layer of control superconductor material to thereby produce a superconductive circuit element.

10. The method of claim 8 wherein said superconductive shield plane and said control superconductor material are lead; wherein said first and second insulating layers are silicon monoxide; wherein said gas is nitromethane; wherein said light has a wavelength of 2000–3000 A.; and wherein said gate superconductor material is tin.

11. A method of fabricating a thin film circuit upon a substrate which comprises:

(a) positioning a substrate in an evacuated chamber;

(b) depositing a first metallic thin film layer in a first predetermined pattern;

(c) depositing a first insulating thin film layer in a second predetermined pattern on said first metallic layer;

(d) depositing a second metallic thin film layer in a third predetermined pattern on said first insulating layer;

(e) introducing into said chamber with a photolyzable gas which upon photolysis produces a chemical entity which reacts with surface of said second metallic layer to produce a stable surface compound forming an adherent film;

(f) illuminating said second metallic layer with light of a predetermined wavelength in a fourth predetermined pattern and in the presence of said photolyzable gas to produce said adherent film and define a positive latent image in said fourth predetermined pattern on the surface on said second metallic layer; and (g) removing unilluminated portions of said second metallic layer to develop said positive latent image by exposing said second metallic layer to a chemical etchant reactive with said second metallic layer and unreactive with said stable surface compound.

12. The method of fabricating thin film semiconductor circuits upon a substrate which comprises:

(a) positioning a substrate in an evacuated chamber;
(b) depositing a thin film of a semiconductor material on said substrate;
(c) introducing into said chamber a photolyzable gas which upon photolysis produces a chemical entity which reacts with the surface of said semiconductor thin film to produce a stable surface compound forming an adherent film;
(d) illuminating said semiconductor thin film with light of a predetermined wavelength in a predetermined pattern in the presence of said photolyzable gas to produce said adherent film and define a positive latent image in said predetermined pattern on the surface of said semiconductor thin film;
(e) removing unilluminated portions of said semiconductor thin film to develop said positive latent image by exposing said semiconductor thin film to a chemical etchant reactive with said semiconductor thin film and unreactive with said stable surface compound;
(f) depositing conductive materials to connect parts of said developed positive latent image of semiconductor material; and
(g) diffusing predetermined materials in and through predetermined regions of said developed positive latent image of semiconductor material.

13. A method for fabricating high resolution thin film patterns on a substrate which comprises:
(a) providing a substrate with a thin film of selected material thereon;
(b) exposing the surface of said thin film to a gas which is reactive with said selected material when exposed to electromagnetic radiation to provide a stable reaction product forming an adherent coating on said thin film surface;
(c) exposing selected portions of said thin film surface to electromagnetic radiation so as to produce said stable reaction product and form said adherent coating on said selected portions of said thin film surface; and
(d) subjecting said thin film to a chemical etchant reactive with said selected material but nonreactive with said stable reaction product whereby said selected portions of said thin film surface are unaffected to define a thin film pattern.

14. The method of claim 13 comprising the further step of forming said thin film of a metallic material.

15. The method of claim 13 comprising the further step of forming said thin film of superconductive material.

16. The method of claim 13 comprising the further step of forming said thin film of semiconductive material.

17. A method for fabricating high resolution thin film patterns on a substrate which comprises:
(a) providing a substrate with a thin film of selected material thereon;
(b) exposing the surface of said thin film to a nitroalkane ambient which upon photolysis produces a chemical entity which reacts with the surface of said thin film to produce a stable surface reaction product from an adherent coating;
(c) illuminating selected surface areas of said thin film with light of a predetermined wavelength to produce said reaction product and form a positive latent image in a predetermined geometric pattern on the surface of said thin film; and
(d) developing the latent image by exposing said thin film to a chemical etchant reactive with said selected material and unreactive with said reaction product to remove unilluminated surface areas of said thin film.

18. A method for fabricating high resolution thin film patterns on a substrate which comprises:
(a) providing a substrate with a thin film of selected material thereon;
(b) exposing the surface of said thin film to a nitromethane ambient which upon photolysis produces a chemical entity which reacts with the surface of said thin film to produce a stable surface reaction product from an adherent coating;
(c) illuminating selected surface areas of said thin film with light of predetermined wavelength to produce said reaction product and form a positive latent image in a predetermined geometric pattern on the surface of said thin film; and
(d) developing the latent image by exposing said thin film to a chemical etchant reactive with said selected material and unreactive with said reaction product to remove unilluminated surface areas of said thin film.

19. A method of fabricating high resolution microminiature thin film solid state circuitry upon the surface of a substrate comprising:
(a) placing a substrate in an evacuated chamber;
(b) depositing at least a first thin film of selected material upon said substrate;
(c) introducing into said chamber a photolyzable gas which upon photolysis produces a chemical entity which reacts with the surface of said first thin film to produce a stable surface compound forming an adherent film on said first thin film surface;
(d) illuminating selected surface portions of said first thin film with light of a predetermined wavelength in a predetermined pattern and in the presence of said photolyzable gas to produce said adherent film and define a positive latent image of said pattern on said first thin film surface;
(e) removing unilluminated surface portions of said first thin film to develop said positive latent image by exposing said first thin film to a chemical etchant reactive with said selected material and unreactive with said surface compound; and
(f) depositing an electrically insulating material in a predetermined pattern on said developed positive latent image.

20. A method of fabricating high resolution microminiature thin film solid state circuitry upon the surface of a substrate comprising:
(a) placing a substrate in an evacuated chamber;
(b) depositing at least a first thin film of selected material upon said substrate;
(c) introducing into said chamber a photolyzable gas which upon photolysis produces a chemical entity which reacts with the surface of said first thin film to produce a stable surface compound forming an adherent film on said first thin film surface;
(d) illuminating selected surface portions of said first thin film with light of a predetermined wavelength in a predetermined pattern and in the presence of said photolyzable gas to produce said adherent film and define a positive latent image of said pattern on said first thin film surface;
(e) removing unilluminated surface portions of said first thin film to develop said positive latent image by exposing said first thin film to a chemical etchant reactive with said selected material and unreactive with said surface compound; and
(f) repeating the process steps to form a multiple layer microminiature thin film solid state circuit.

21. The method of fabricating a thin film superconductive circuit element upon a substrate which comprises:
(a) positioning a substrate in an evacuated chamber;
(b) depositing by thermal evaporation a superconductive shield plane on said substrate;
(c) depositing on said superconductive shield plane a first insulating layer;
(d) depositing by thermal evaporation on said first insulating layer a thin film layer of gate superconductor material selected from Group IV of the Periodic Table;

(e) introducing a nitroalkane ambient in said chamber which upon photolysis produces a chemical entity which reacts with said thin film layer of gate superconductor material to produce a stable surface compound forming an adherence film;

(f) illuminating said thin film layer of gate superconductor material with light having a wavelength of 2000–3000 A. in a predetermined pattern and in the presence of said nitroalkane to produce said adherent film and define a positive image in said predetermined pattern on the surface of said thin film layer of gate superconductor material;

(g) removing unilluminated surface portions of said thin film layer of gate superconductor material to develop said positive latent image by exposing said thin film layer of gate superconductor material to a chemical etchant reactive with said gate superconductor material and unreactive with said stable surface compound;

(h) depositing a second insulating layer in a predetermined pattern on said developed positive latent image of said gate superconductor material; and (i) depositing by thermal evaporation in a predetermined pattern on said second insulating layer a thin film layer of control superconductor material selected from Group IV of the Periodic Table to thereby produce a superconductive circuit element.

22. The method of fabricating a thin film semiconductor circuit upon a substrate which comprises:

(a) positioning a substrate in an evacuated chamber;

(b) depositing a thin film of germanium on said substrate;

(c) introducing a nitroalkane ambient in said chamber which upon photolysis produces a chemical entity which reacts with the surface of said thin film to produce a stable surface compound forming an adherent film;

(d) illuminating the surface of said thin film with light having a wavelength of 2000–3000 A. and in a predetermined pattern in the presence of said nitroalkane to produce said adherent film and define a positive latent image in said predetermined pattern on the surface of said thin film;

(e) removing unilluminated portions of said thin film to develop said positive latent image by exposing said thin film to a chemical etchant reactive with said germanium and unreactive with said stable surface compound;

(f) depositing conductive materials selected from the group consisting of zinc and antimony to connect parts of said developed positive latent image of semiconductor material; and (g) diffusing predetermined materials selected from the group consisting of boron and antimony in and through predetermined regions and said developed positive latent image of semiconductor material.

References Cited

UNITED STATES PATENTS

| | | | |
|---|---|---|---|
| 3,056,881 | 10/1962 | Schwarz | 117—212 |
| 3,095,341 | 6/1963 | Ligenza | 156—17 |
| 3,114,652 | 12/1963 | Schetky | 117—107.2 |
| 3,132,046 | 5/1964 | Mann | 117—212 |

OTHER REFERENCES

Anderson et al.: "J. of Phy. Chem," vol. 56, No. 4, April 1952, pp. 498–502.

Konig et al.: "Zeitschrift fur Physik," vol. 129, pages 491–503, 1951, page 491 relied on.

ALFRED L. LEAVITT, *Primary Examiner.*

RICHARD D. NEVIUS, JOSEPH REBOLD, W. L. JARVIS, *Assistant Examiners.*